United States Patent
Young et al.

(10) Patent No.: US 6,924,963 B2
(45) Date of Patent: Aug. 2, 2005

(54) ESD PROTECTION NETWORK UTILIZING PRECHARGE BUS LINES

(75) Inventors: William R. Young, Palm Bay, FL (US); Gregg D. Croft, Palm Bay, FL (US)

(73) Assignee: Intersil Americas Inc., Milpitas, CA (US)

(*) Notice: Subject to any disclaimer, the term of this patent is extended or adjusted under 35 U.S.C. 154(b) by 447 days.

(21) Appl. No.: 10/076,716

(22) Filed: Feb. 14, 2002

(65) Prior Publication Data

US 2003/0151877 A1 Aug. 14, 2003

(51) Int. Cl.$^7$ .................................................. H02H 3/22
(52) U.S. Cl. ........................................ 361/111; 361/56
(58) Field of Search ............................... 361/54, 56, 78, 361/91, 111, 112, 115, 212, 220; 257/355–360

(56) References Cited

U.S. PATENT DOCUMENTS

| | | | | |
|---|---|---|---|---|
| 5,276,582 A | * | 1/1994 | Merrill et al. | 361/111 |
| 5,291,051 A | * | 3/1994 | Hoang et al. | 257/360 |
| 5,432,916 A | * | 7/1995 | Hahn et al. | 710/302 |
| 5,477,414 A | * | 12/1995 | Li et al. | 361/56 |
| 5,940,258 A | | 8/1999 | Duvvury | |
| 5,982,217 A | | 11/1999 | Chen et al. | |
| 6,046,897 A | * | 4/2000 | Smith et al. | 361/111 |
| 6,051,457 A | | 4/2000 | Ito | |
| 6,144,542 A | * | 11/2000 | Ker et al. | 361/111 |
| 6,522,511 B1 | * | 2/2003 | John et al. | 361/56 |
| 6,535,368 B2 | * | 3/2003 | Andresen et al. | 361/56 |
| 6,580,591 B2 | * | 6/2003 | Landy | 361/56 |

* cited by examiner

*Primary Examiner*—Jonathan Salata
(74) *Attorney, Agent, or Firm*—Fogg and Associates, LLC; Scott V. Lundberg

(57) ABSTRACT

An electrostatic discharge protection circuit for an integrated circuit that reduces unwanted transient currents during normal operations. In one embodiment, the electrostatic discharge protection circuit includes one or more electrostatic bus lines, a plurality of signal bonding pads and charge pumps. The one or more electrostatic bus lines are used to direct electrostatic discharge around internal circuitry. The plurality of signal bonding pads are used to receive external voltage signals. Each signal bonding pad is coupled to an associated electrostatic bus line via an unidirectional conducting device. A charge pump is used on each electrostatic bus line to precharge its associated electrostatic bus line to an associated predetermined voltage level. The precharging of each electrostatic bus line to its predetermined voltage level reduces transient currents through the unidirectional conducting devices when external voltage signals having voltage levels beyond normal supply voltage ranges are applied to the signal bonding pads.

57 Claims, 7 Drawing Sheets

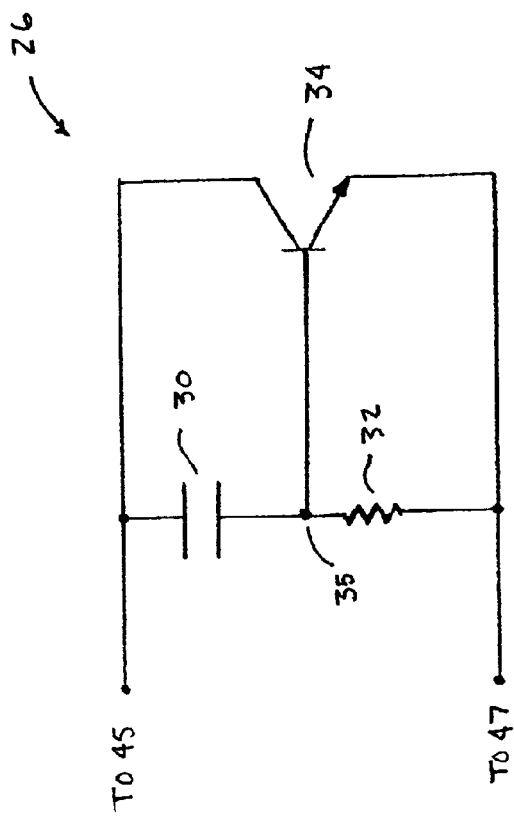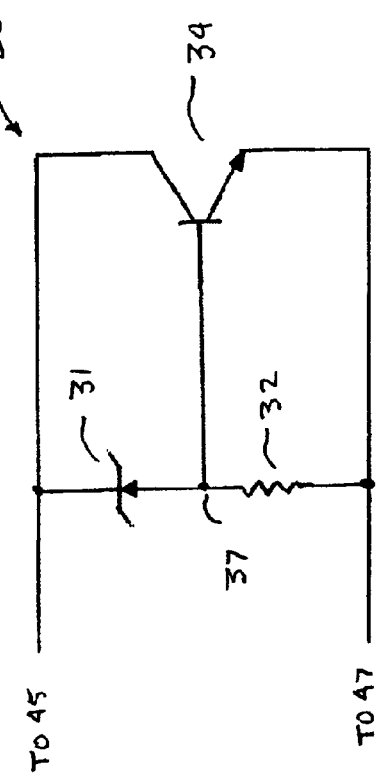

ESD PROTECTION NETWORK UTILIZING PRECHARGE BUS LINES

TECHNICAL FIELD

The present invention relates generally to electrostatic discharge (ESD) protection. More specifically, the present invention relates to an ESD protection device and method comprising a precharged bus line designed to protect the components of an integrated circuit and to prevent deleterious effects caused by undesirable transient currents during operation.

BACKGROUND

Integrated circuits (ICs) may be severely damaged by electrostatic discharge (ESD) phenomena. An IC may be exposed to ESD from many sources. A major source of ESD exposure to ICs is the human body. A charge of about 0.6 microcoulombs can be induced on a body capacitance of 100 pF, leading to electrostatic discharge potentials of 4 kV or greater. Any contact by a charged human body with a grounded object, such as a pad of an IC, can produce an electrostatic discharge with approximately a 10 nanosecond (ns) rise time and a discharge time of approximately 450 ns (i.e., the total discharge time is approximately equivalent to three time constants, where each time constant is approximately 150 nanoseconds), during which peak currents of several amps are input into the IC.

A second source of ESD is a metallic object. The metallic object ESD source model is characterized as having a greater capacitance and lower internal resistance than the human body model discussed above. Metallic objects produce ESD transient with approximately the same rise time as a human body discharge but the discharge rings as the nearly negligible resistance of the metallic object results in an underdamped condition.

A third source of ESD is a charge device, involving situations where the IC itself becomes charged and then discharged to ground. The charge device pulses have very fast rise times (approximately one hundred picosecond) compared to those generated by a human body. The charge device current also rings with a short ringing interval of approximately one nanosecond.

A common ESD IC protection scheme uses a network of diodes or transistors and supply clamps to attempt to divert the potentially destructive energy of a static discharge around any sensitive internal circuitry. However, some circuit applications require signal pins of ICs to occasionally operate at voltages above the positive voltage supply (Vdd) or voltages below the negative supply voltage (Vss). The performance of internal circuitry protected by such an ESD protection scheme can become unreliable when signal pins are exposed to required positive or negative pulses that exceed normal operating voltage levels. This is generally due to parasitic currents that occur, through diodes or transistors incorporated in ESD protection schemes, when the voltage levels either exceed Vdd or are lower than Vss. The parasitic currents can degrade the operational signals and cause latch up problems in the ICs.

For the reasons stated above, and for other reasons stated below which will become apparent to those skilled in the art upon reading and understanding the present specification, there is a need in the art for an ESD protection scheme that is reliable even when required positive or negative voltage signals are applied to signal pins that exceed normal operating voltage levels.

SUMMARY

The above-mentioned problems and other problems are addressed by the present invention and will be understood by reading and studying the following specification.

In one embodiment, an electrostatic discharge protection circuit is disclosed. The electrostatic discharge protection circuit includes one or more electrostatic bus lines, a plurality of signal bonding pads and a charge pump for each electrostatic bus line. The one or more electrostatic bus lines are used to direct electrostatic discharge around internal circuitry. The plurality of signal bonding pads are used to receive external voltage signals. Each signal bonding pad is coupled to an associated electrostatic bus line via an unidirectional conducting device. Each charge pump is used to precharge its associated electrostatic bus line to an associated predetermined voltage level. The pre-charging of each electrostatic bus line to its predetermined voltage level reduces transient currents on the signal bonding pads associated with capacitive charging of the electrostatic bus lines when the external voltage signals levels are beyond normal supply voltage ranges.

In another embodiment an integrated circuit comprises functional circuitry, first and second ESD bus lines, first and second charge pumps and first and second unidirectional conducting devices. The first ESD bus line is used to direct electrostatic discharge pulses away from the functional circuitry. The first charge pump is coupled to charge the first ESD bus line to a predetermined first voltage. The second ESD bus line is used to further direct electrostatic discharge pulses away from the functional circuitry. The second charge pump is coupled to charge the second ESD bus line to a predetermined second voltage. The first unidirectional conducting device is coupled between a first signal connection and the first ESD bus line. The second unidirectional conducting device is coupled between a second signal connection and the second ESD bus line. The first and second ESD bus lines are charged to their respective first and second voltage levels to reduce transient currents through the first and second unidirectional conducting devices when voltages applied to the first and second signal connections are outside the normal range of power supply operating voltages for the integrated circuit.

In another embodiment, an ESD protected integrated circuit comprises a positive ESD bus line, first and second signal bonding pads, a first unidirectional conducting device, a second bus line, a second unidirectional conducting device and a positive rail charge pump. The positive ESD bus line is used to route positive electrostatic discharge pulses around functional circuitry. The first and second signal bonding pads are used to receive external voltage signals. The first unidirectional conducting device is coupled between the first signal bonding pad and the positive ESD bus line. The second bus line is coupled to selectively receive current from the positive ESD bus line. The second unidirectional conducting device is coupled between the second signal bonding pad and the second bus line. The positive rail charge pump is coupled to charge the positive ESD bus line to a predefined voltage level, wherein the predefined voltage level is higher than anticipated voltage signal levels that will be applied to the first signal bonding pad to reduce parasitic currents through the first unidirectional conducting device during normal operations of the integrated circuit where voltage signals higher than a normal power supply operating voltage, but less than the predefined voltage signals, are applied to the first signal bonding pad.

In another embodiment, an ESD protected integrated circuit comprises a negative ESD bus line, first and second signal bonding pads, a first unidirectional conducting device, a second bus line, a second unidirectional conducting device and a negative rail charge pump. The negative ESD bus line is used to route negative electrostatic discharge pulses around functional circuitry. The first and second signal bonding pads are used to receive external voltage signals. The first unidirectional conducting device is coupled between the first signal bonding pad and the negative ESD bus line. The second bus line is coupled to selectively receive current from the negative ESD bus line. The second unidirectional conducting device is coupled between the second signal bonding pad and the second bus line. A negative rail charge pump is coupled to charge the negative ESD bus line to a predefined voltage level, wherein the predefined voltage level is lower than anticipated voltage signal levels that will be applied to the first signal bonding pad to reduce parasitic currents through the first unidirectional conducting devices during normal operations of the integrated circuit where voltage signals lower than a normal power supply operating voltage, but more than the predefined voltage signals, are applied to the first signal bonding pad.

In another embodiment, a method of operating an integrated circuit that requires signal voltages outside the normal range of power supply operational voltages, the integrated circuit including an electrostatic discharge circuit having one or more electrostatic discharge bus lines. The method comprising, pre-charging each of the electrostatic discharge bus lines to a respective predetermined voltage level, wherein each predetermined voltage level is a voltage level beyond the signal voltage level expected to be applied to the integrated circuit.

In another embodiment, a method of operating an integrated circuit having electrostatic discharge protection. The method comprising, coupling a positive ESD bus line to an integrated circuit to direct positive electrostatic pulses away from functional circuitry of the integrate circuit, pre-charging the positive ESD bus line to a predetermined positive voltage level, wherein the predetermined positive voltage level is above the voltage level of expected signals to be applied to the integrated circuit. Coupling a negative ESD bus line to the integrated circuit to direct negative electrostatic pulses away from the functional circuitry of the integrated circuit and pre-charging the negative ESD bus line to a predetermined negative voltage level, wherein the predetermined negative voltage level is below the voltage level of expected signals to be applied to the integrated circuit.

BRIEF DESCRIPTION OF THE DRAWINGS

The present invention can be more easily understood and further advantages and uses thereof more readily apparent, when considered in view of the description of the preferred embodiments and the following figures in which:

FIG. 2A is a schematic diagram of one embodiment of a supply clamp of the present invention;

FIG. 2B is a schematic diagram of another embodiment of a supply clamp of the present invention;

In accordance with common practice, the various described features are not drawn to scale but are drawn to emphasize specific features relevant to the present invention. Reference characters denote like elements throughout Figures and text.

DETAILED DESCRIPTION

In the following detailed description of the preferred embodiments, reference is made to the accompanying drawings, which form a part hereof, and in which is shown by way of illustration specific preferred embodiments in which the inventions may be practiced. These embodiments are described in sufficient detail to enable those skilled in the art to practice the invention, and it is to be understood that other embodiments may be utilized and that logical, mechanical and electrical changes may be made without departing from the spirit and scope of the present invention. The following detailed description is, therefore, not to be taken in a limiting sense, and the scope of the present invention is defined only by the claims and equivalents thereof.

Embodiments of the present invention are described with reference to two voltages designated Vss and Vdd. Those skilled in the art recognize that these voltage references can be implemented from two separate voltage sources, or Vdd and Vss can be opposite terminals of a single voltage source. In any case, it is only the relationship between Vdd and Vss that is important; Vdd is the most positive voltage; Vss is the most negative voltage, i.e., Vdd is greater than Vss. Typically, Vdd is a positive value greater than zero and Vss is a negative value less than zero. But this is not necessary. Also, in many applications Vss is in fact ground potential, although again this is not always the case. In fact, Vdd can be at ground or zero potential and Vss would therefore be a negative voltage.

Figure 1:
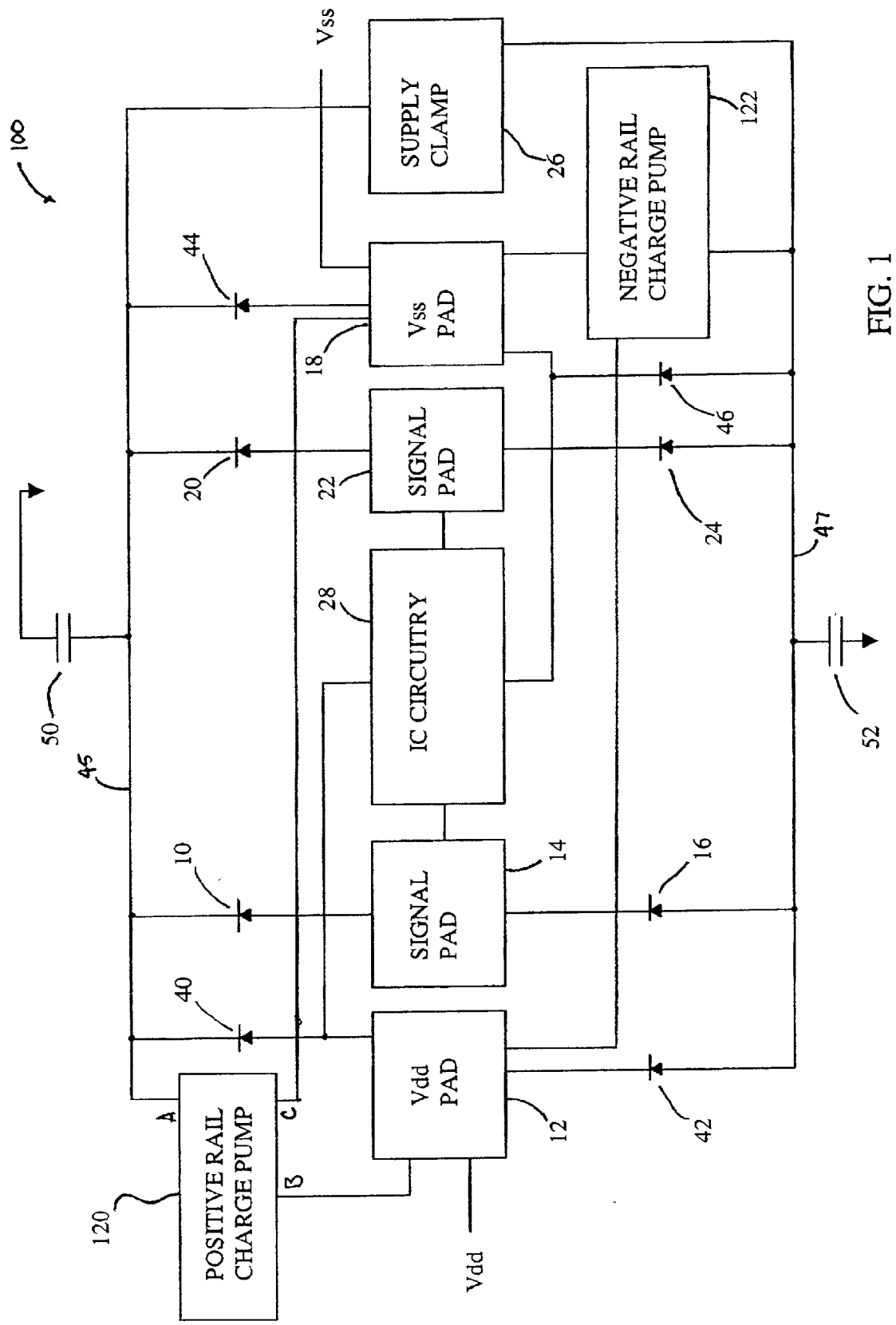
FIG. 1 is a schematic diagram of one embodiment of the present invention.

Referring to FIG. 1, one embodiment of an ESD protected integrated circuit 100 of the present invention is illustrated. As illustrated, the ESD protected integrated circuit 100 includes a power supply (Vdd) bonding pad 12 and a power supply (Vss) bonding pad 18. The Vdd bonding pad 12 is coupled to receive Vdd. The Vdd bonding pad 12 is coupled to a first ESD bus line 45 by diode 40. In particular, the cathode terminal of diode 40 is coupled to the first ESD bus line 45 and the anode terminal of diode 40 is coupled to the Vdd bonding pad 12. In addition, Vdd bonding pad 12 is also coupled to a second ESD bus line 47 by diode 42. In particular, the cathode terminal of diode 42 is coupled to the Vdd bonding pad 12 and the anode terminal of diode 42 is coupled to the second ESD bus line 47. The Vss bonding pad 18 is coupled to receive Vss. In addition, Vss bonding pad 18 is coupled to the first ESD bus line 45 by diode 44. In particular, the cathode terminal of diode 44 is coupled to the first ESD bus line 45 and the anode terminal of diode 44 is coupled to the Vss bonding pad 18. Moreover, Vss bonding pad 18 is coupled to the second ESD bus line 47 by diode 46. In particular, the cathode terminal of the diode 46 is coupled to the Vss bonding pad 18 and the anode terminal of diode 46 is coupled to ESD bus line 47.

The ESD protected integrated circuit 100 has a first signal bonding pad 14 and a second signal bonding pad 22. The first signal bonding pad 14 can be referred to as a first signal connection 14 and the second signal bonding pad 22 can be referred to as a second signal connection 22. The first signal bonding pad 14 is coupled to the first ESD bus line 45 by diode 10. In particular, the cathode terminal of diode 10 is coupled to the first ESD bus line 45 and the anode terminal of diode 10 is coupled to the first signal bonding pad 14. The first signal bonding pad 14 is also coupled to the second ESD bus line 47 by diode 16. In particular the cathode terminal of diode 16 is coupled to the first signal bonding pad 14 and the anode terminal of diode 16 is coupled to ESD bus line 47. The second signal bonding pad 22 is coupled to the first ESD bus line 45 with diode 20. In particular, the cathode terminal of diode 20 is coupled to the first ESD bus line 45 and the anode terminal of diode 20 is coupled to the second signal bonding pad 22. The second signal bonding pad 22 is also coupled to the second ESD bus line 47 by diode 24. In particular, the cathode terminal of diode 24 is coupled to the second signal bonding pad 22 and the anode terminal of diode 24 is coupled to the second ESD bus line 47.

The ESD protected integrated circuit 100 includes IC circuitry 28. The IC circuitry 28 is the internal functional circuitry of the integrated circuit and may be referred to as internal or functional circuitry 28. The IC circuitry performs the function of the integrated circuit 100. For example, the IC circuitry may be some type of processor, logic circuit or memory storage circuit. The present invention protects the IC circuitry 28 from the destructive energy of static discharges. As shown in FIG. 1, the IC circuitry 28 is coupled to the anode terminal of diode 40 and the Vdd bonding pad 12. Moreover, the IC circuitry 28 is also coupled to the cathode terminal of diode 46, Vdd 12, diode 40, signal pads 14 and 22 and the Vss bonding pad 18. In addition, the first ESD bus line 45 can be referred to as the positive ESD bus line 45 and the second ESD bus line 47 can be referred as the negative ESD bus line 47. Also illustrated in FIG. 1, is capacitance 50, which represents the capacitance of bus line 45 and capacitor 52, which represents the capacitance in of bus line 47.

In addition, as illustrated in FIG. 1, the ESD protected integrated circuit 100 also includes a supply clamp 26 that is coupled between the positive and negative ESD bus lines 45 and 47. The supply clamp 26 is used to selectively conduct when an electrostatic pulse is detected. The supply clamp 26 can be referred to as a switching device 26. One embodiment of the supply clamp 26 of the present invention is illustrated in FIG. 2A. As illustrated, the supply clamp 26 includes capacitor 30, resistor 32 and transistor 34. A first terminal of the capacitor 30 is coupled the positive ESD bus line 45 and a second terminal of capacitor 30 is coupled to node 35. Resistor 32 is coupled between node 35 and the negative ESD bus line 47. The base terminal of transistor 34 is coupled to node 35. The collector/emitter path of transistor 34 is coupled between the positive and negative ESD bus lines 45 and 47 as shown. In operation, as capacitor 30 is charged by an ESD pulse, transistor 34 turns on. The collector/emitter path then forms a low impedance path between the positive and negative ESD bus lines 45 and 47. During normal operations, the resistor 32 discharges node 35 thereby turning off the transistor 34. In other embodiments, the supply clamp 26 is implemented with a bipolar junction transistor, a MOSFET, a JFET, an SCR or any other device capable of conducting with low impedance to steer the ESD pulse around the IC circuitry 28. Such devices may be switched on by the fast rise time voltage of the ESD pulse or the voltage level of the ESD pulse. In still another embodiment, a zener diode may be used instead of the supply clamp 26. This may not be desired because zener diodes typically have a higher impedance than a collector/emitter path through the transistor 34.

However, in another embodiment of the supply claim 26, a zener diode 31 is used as a trigger as illustrated in FIG. 2B. In this embodiment, the cathode of the zener diode 31 is coupled to the positive ESD bus line 45 and the anode of zener diode 31 is coupled to node 37. Resistor 32 is coupled between node 37 and the negative ESD bus line 47. The base terminal of transistor 34 is coupled to node 37. The collector/emitter path of transistor 34 is coupled between the positive and negative ESD bus lines as shown in FIG. 2B.

In operation, when a positive ESD pulse is detected form signal pad 14 to signal pad 22, the supply clamp 26 conducts. Thereafter, the ESD pulse is discharged through forward biased diode 10, ESD bus line 45, supply clamp 26, forward biased diode 24 and signal bonding pad 22. When a negative ESD pulse is detected the supply clamp 26 also conducts. The negative ESD pulse causes forward biasing of diode 16. This pulse is then discharged through forward biased diode 16, ESD bus line 47, supply clamp 26, ESD bus line 45 and finally through forward biased diode 20.

Referring back to FIG. 1, the ESD protected integrated circuit 100 of this embodiment further has a positive rail charge pump 120 and a negative rail charge pump 122. The positive rail charge pump 120 is coupled between the Vdd bonding pad 12 and the positive ESD bus line 45. The negative rail charge pump 122 is coupled between the Vss bonding pad 18 and the negative bus line 47. The positive ESD bus line 45 is precharged to a voltage greater than the most positive expected input signal voltage by the positive rail charge pump 120. Similarly, the negative ESD bus line 47 is charged to a voltage below the most negative expected signal voltage by the negative rail charge pump 122.

The use of charge pumps 120 and 122 reduce the degradation of required operational voltage signals to the integrated circuit 100 that either exceed the positive Vdd or are less then the negative Vss. In particular, pre-charging the ESD bus lines 45 and 47 to their predetermined values reduces transient currents, associated with the charging of the capacitance of the ESD bus lines 45 and 47, on the signal bonding pads 14 and 22. When ESD bus lines 45 and 47 are pre-charged to the desired voltages, the steering diodes 10, 16, 20, 24, 40, 42, 44 and 46 remain in a reversed bias state during normal operations even if the voltage levels on the signal bonding pads 14 and 22 are beyond the normal range of the supply voltages. The steering diodes 10, 16, 20, 24, 40, 42, 44 and 46 may include Schottky diodes, vacuum diodes, junctions of bipolar junction transistors or any other unidirectional conducting device. In the absence of the charge pumps 120 and 122, signal voltages in excess of Vdd or less than Vss would cause transient parasitic currents to flow through the ESD steering diodes 10, 16, 20 and 24 in charging the ESD bus lines 45 and 47. The parasitic currents could degrade the operational signals and cause latch up problems in the IC circuitry 28 thereby reducing the reliability of the IC circuitry 28.

Moreover, the charge pumps 120 and 122 are used to generate a respective second, reasonably stable, DC voltage from a respective first supply voltage. Advantageously, the DC circuit drive requirements of the charge pumps 120 and 122 are minimal, since the charge pumps 120 and 122 only have to provide a current to compensate for DC leakage currents of diodes 10, 16, 20, 24, 40, 42, 44 and 46 and the supply clamp 26. When the IC circuitry 28 is powered up, the charge pumps 120 and 122 are required to charge their respective bus lines (i.e., the positive ESD bus line 45 and the negative bus line 47, respectfully), to a desired voltage within a specified time. The desired voltage is chosen based on the application for the IC circuitry 28. In any case, the positive bus line 45 should be charged to a value greater than the highest expected signal voltage that will be applied to signal pad 14 or 22. Moreover, the negative bus line 47 should be charged to a value less than the lowest expected signal voltage that will be applied to signal pad 14 or 22. Generally, it is not difficult for the positive and negative rail charge pumps 120 and 122 to charge the bus lines as required because the Vdd and Vss supply voltages provide much of the initial charging current. Further, the duration of the power-up cycle is generally long enough to give the charge pumps adequate time to charge the positive and negative ESD bus lines 45 and 47 to the desired value. Generally, the time required to charge the ESD bus lines 45 and 47 will be between a few microseconds and a few milliseconds.

After the ESD bus lines 45 and 47 are precharged, according to the present invention, diodes 10, 16, 20, 24, 40, 42, 44 and 46, remain reversed biased when signal voltages between the positive precharge value of positive ESD bus line 45 and the negative precharge value of negative ESD bus line 47 are input to the IC circuitry 28. Only capacitively-coupled transient currents from the input signals or ESD pulses and reverse bias leakage currents flow through the diodes 10, 16, 20, 24, 40, 42, 44 and 46. Since, it is known that the vast majority of the ESD pulses occur when the IC is not powered or functioning in an operational mode, the charging of the ESD bus lines 45 and 47 at power up does not hamper the electrostatic protection provided by the ESD protection device. In addition, during operational modes, when a positive ESD pulse having a voltage level higher than the voltage level of the positive ESD bus line 47 is applied between signal pads 14 and 22 the supply clamp 26 conducts. The positive ESD pulse is then discharged through forward biased diode 10, ESD bus line 45, supply clamp 26, forward biased diode 24 and signal bonding pad 22. Likewise, if a negative ESD pulse that has a voltage level below the negative ESD bus line is applied between signal bonding pads 14 and 22 the supply clamp also activates. The ESD pulse is then discharged through forward biased diode 16, ESD bus line 47, supply clamp 26, ESD bus line 45 and finally through forward biased diode 20.

Although, the embodiment illustrated in FIG. 1 only shows two signal bonding pads 14 and 22 or signal connections 14 and 22, those skilled in the art will recognize that additional signal bonding pads are generally included with the IC circuitry 28 and that each additional signal bonding pad can be protected by the appropriate placement of diodes in a manner identical to the placement of diodes associated with signal bonding pads 14 and 22. Accordingly, the present invention is not limited to having only two signal pads.

An additional benefit of the use of charge pumps 120 and 122 in accordance with the present invention is the creation of a greater reverse bias voltage across diodes 10, 16, 20, 24, 40, 42, 44 and 46 during normal operations of the IC circuitry 28. The larger reverse bias voltage reduces the capacitance per area of the diodes (by increasing the depletion region width of each diode) and thus reduces the capacitivity-coupled transient currents. Of course, the larger the reverse bias voltage requires that each diode have a corresponding higher reverse-breakdown voltage.

Figure 3:
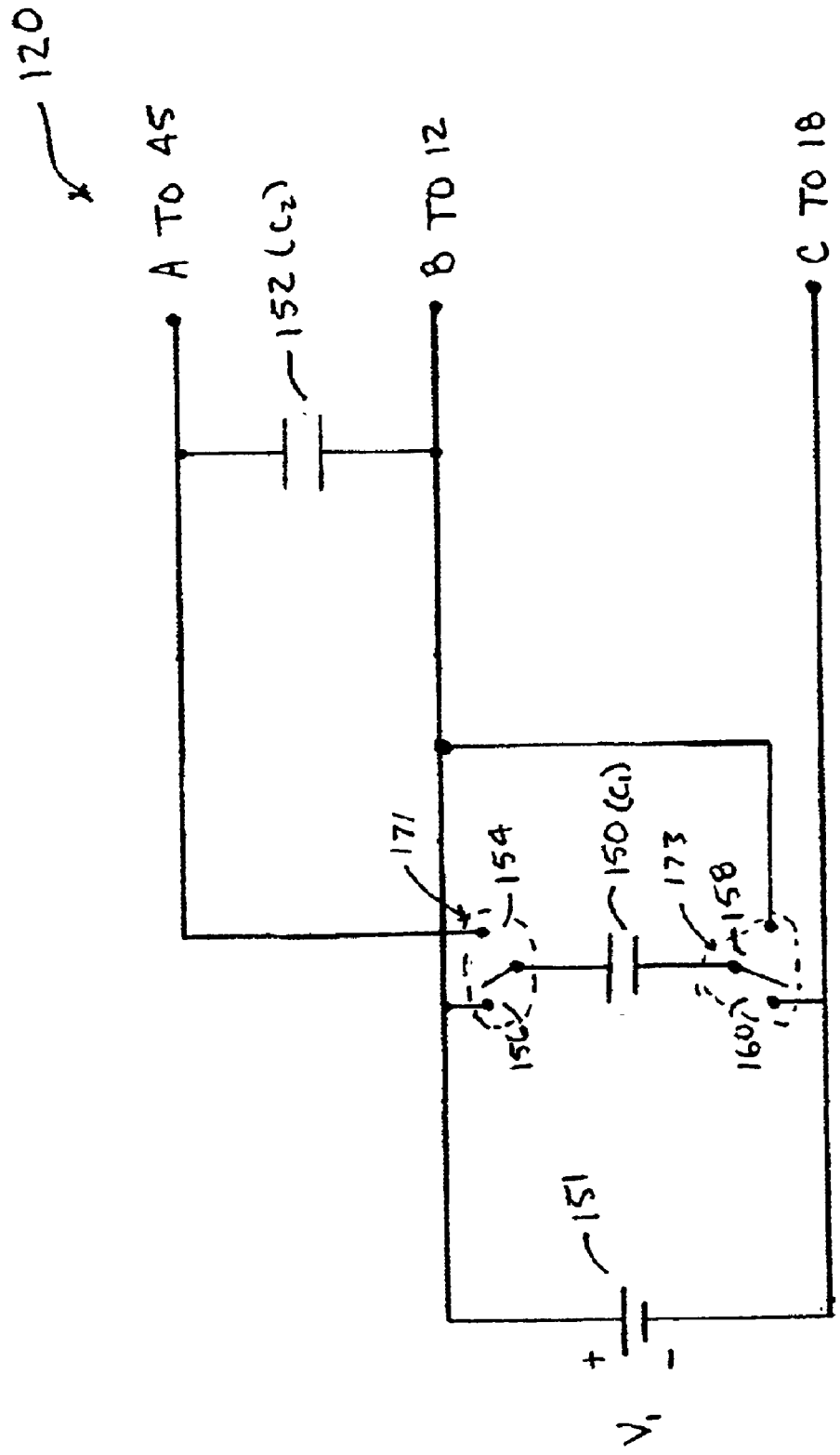
FIG. 3 is a schematic diagram of one embodiment of a positive rail charge pump of the present invention.

An embodiment of a positive rail charge pump 120 is illustrated in FIG. 3. As illustrated, the positive rail charge pump has a first switch 154 that has a first side coupled to node A and a second side that is coupled to a first plate of a first capacitor 150. A second switch 156 has a first side also coupled to the first plate of the first capacitor 150 and a second side coupled to the positive terminal of power source 151 and to node B. A second capacitor 152 has a first plate coupled to the first side of the switch 154 and node A and a second plate coupled to the positive terminal of the power source 151 and node B. Also illustrated is third and fourth switches 158 and 160. The third switch 158 has a first side that is coupled to a second plate of capacitor 150 and a second side coupled the positive terminal of the power supply 151, node B and the second plate of capacitor 152. The fourth switch 160 has a first side coupled to the second plate of capacitor 150 and a second side coupled to a negative terminal of the power source 151 and node C. In particular, in the embodiment of FIG. 3, each pair of switches (156 and 154) and (160 and 158) form a single pole double throw switch denoted as switches 171 and 173 respectively. As further illustrated by FIG. 3, node A is coupled to the positive ESD bus line 45, node B is coupled to the Vdd bonding pad 12 and Node C is coupled to the Vss bonding pad 18.

In operation, assume initially, switches 154, 156, 158 and 160 are open and capacitors 150 (C1) and 152 (C2) are discharged. Closing switches 156 and 160 charges capacitor 150 (C1) to V1. Opening switches 156 and 160 and then closing switches 154 and 158 connects capacitor 150 (C1) in parallel with capacitor 152 (C1). The total charge initially stored on capacitor 150 (C1) equals C1V1. This charge redistributes when C1 is connected in parallel with C2 and the voltage across the capacitors becomes V1(C1/(C1+C2)). Switches 154 and 158 open and then switches 156 and 160 close, recharging capacitor 150 (C1) to V1. When switch 154 is open, capacitor 152 (C2) supplies the voltage between node A and B. Placing a load across nodes A and C removes charge from capacitor 152 (C2). If the rate of charge removal from capacitor 152 (C2) by the load is small compared to the rate at which capacitor 150 (C1) supplies charge to capacitor 152 (C2), then the voltage across capacitor (C2) will approach V1 and the voltage from node A to node C will approach 2V1. To charge capacitors 150 (C1) and 152 (C2), switches 154 and 158 and switches 156 and 160 alternate between being open and close cycles, under the control of a control circuit (not shown). A negative charge pump can be similarly implemented. The charge pump of FIG. 3 provides adequate voltage to prevent input signals from forward biasing the diodes 10, 20, 40 and 44 of FIG. 1.

Figure 4:
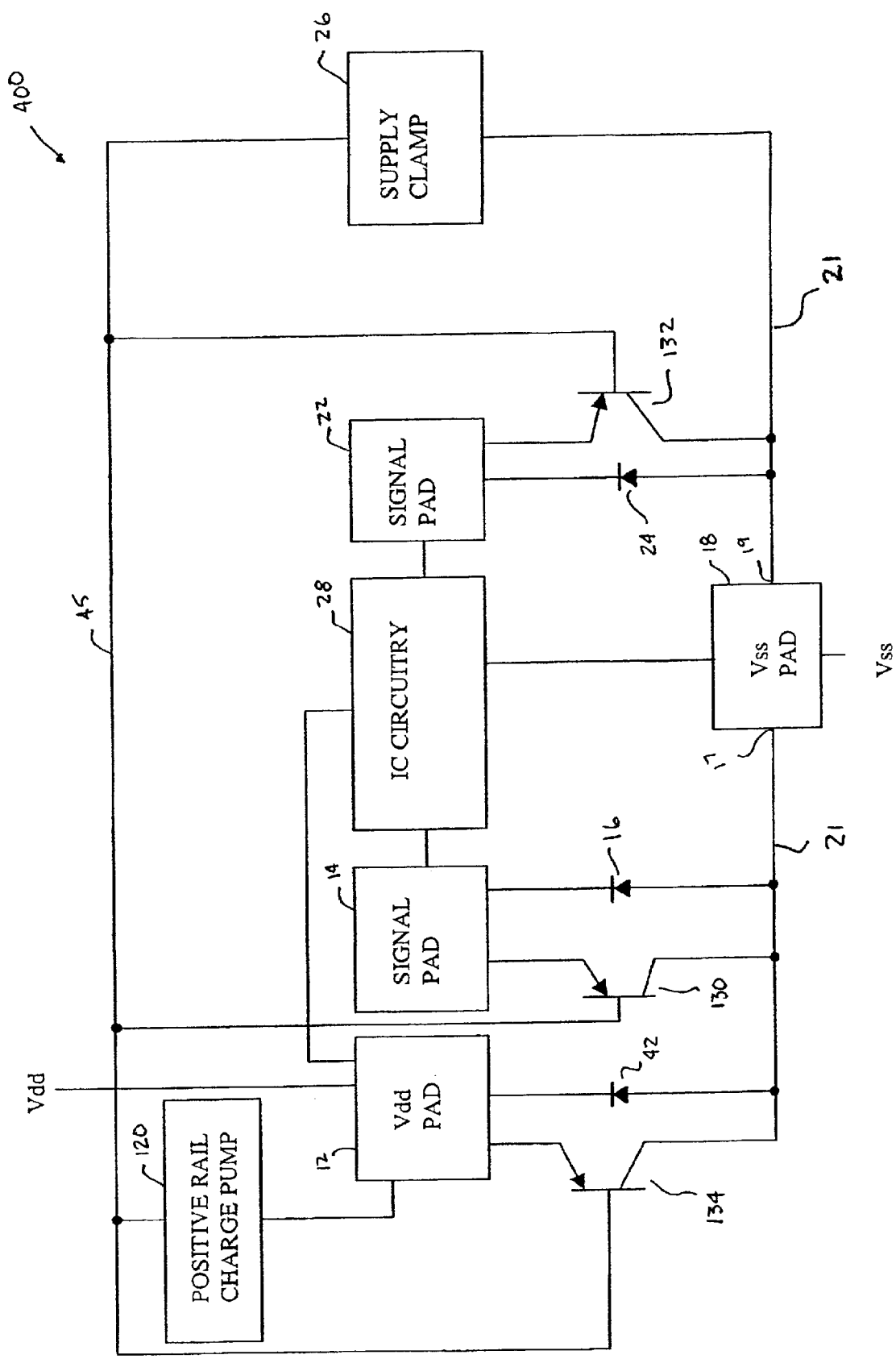
FIG. 4 is a schematic diagram of one embodiment of the present invention with a positive rail charge pump.

Referring to FIG. 4, another embodiment of an ESD protection circuit 400 is illustrated. As illustrated, the ESD protection circuit 400 of this embodiment includes the positive rail charge pump 120 and transistors 130, 132 and 134. Each transistor 130, 132 or 134 can be referred to as a unidirectional conducting device. The positive rail charge pump 120 is coupled between the positive ESD bus line 45 and the Vdd bonding pad 12 and is used to precharge the positive ESD bus line 45. The emitter/collector path of transistor 134 is coupled between the Vdd bonding pad 12 and a first input 17 of the Vss bonding pad 18. The base terminal of transistor 134 is coupled to the positive ESD bus line 45. The emitter/collector path of transistor 130 is coupled between the first signal bonding pad 14 and the first input 17 of the Vss bonding pad 18. The base terminal of transistor 130 is coupled to the positive ESD bus line 45. The emitter/collector path of transistor 132 is coupled between the second signal bonding pad 22 and a second input 19 of the Vss bonding pad 18. The base terminal of transistor 132 is coupled to the positive ESD bus line 45.

Moreover, as FIG. 4 illustrates, Vdd bonding pad 12 and Vss bonding pad 18 are coupled to the IC circuitry 28. In addition, the first signal bonding pad 14 and the second signal bonding pad 22 is also coupled to the IC circuitry 28. As illustrated, the supply clamp 26 is coupled between the positive ESD bus line 45 and the second input 19 of the Vss pad 18. In addition, Vdd is coupled to the Vdd bonding pad 12 and Vss is coupled to the Vss bonding pad 18. Also illustrated is Vss bus line 21.

The charge pump 120 of the present invention is used to precharge the positive ESD bus line 45. This causes the base/emitter path of the transistor 130, 132 and 134 to be reversed biased. In operation, for example, if a positive polarity ESD pulse is applied between signal pads 14 and 22 of ESD protection circuit 400, a discharge current will start at signal pad 14 and flow through the now forward biased base/emitter diode of transistor 130 to the positive ESD bus line 45. The current will then flow through the supply clamp 26 to the Vss bus line 21. From there, the current will flow through forward biased diode 24 to signal pad 22. In addition to the aforementioned discharge path, another secondary path will also be taken by the discharge current. This secondary discharge path flows from signal pad 14 through the emitter/collector of transistor 130. Current passing through the base/emitter path allows the current through the emitter/collector path of transistor 130. The current then flows through the Vss bus line 21 and the forward biased diode 24 to signal pad 22.

Figure 5:
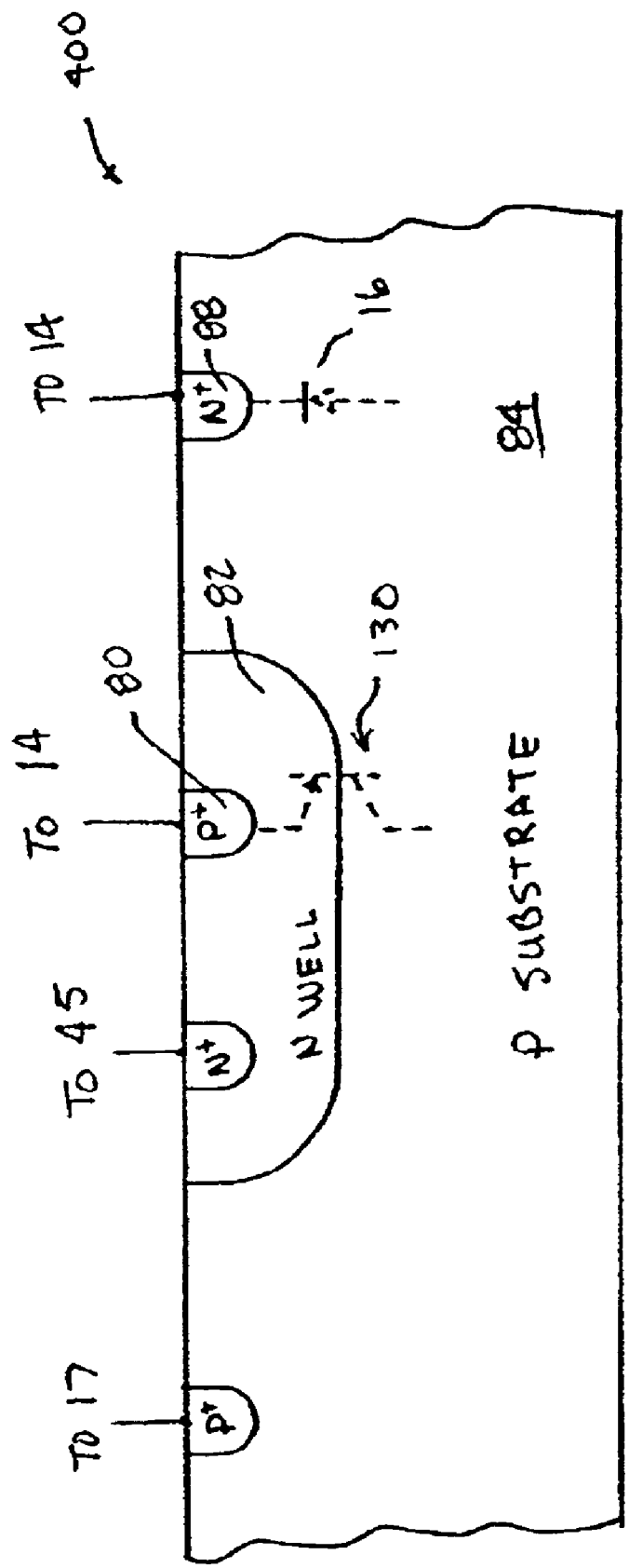
FIG. 5 is a cross-sectional view of a portion of an integrated circuit of the present invention illustrating one embodiment of a transistor in a N well CMOS structure.

Transistors 130, 132 and 134 in the embodiment of FIG. 4 are created with a single well complementary metal oxide semiconductor (CMOS) N well process in an N well CMOS structure. A cross sectional view of a portion of the integrated circuit that contains the ESD protection integrated circuit 400 of FIG. 4 is illustrated in FIG. 5. In particular, FIG. 5 illustrates transistor 130. As FIG. 5 illustrates, a P+ source/drain diffusion 80 is formed in a N well diffusion 82. The P+ diffusion 80 and the N well diffusion 82 together with the underlying P substrate 84, form the vertical parasitic PNP transistor 130. FIG. 5 also illustrates diode 16. Diode 16 is formed by placing an N+ source/drain diffusion 88 into the P substrate. In addition, transistors 134 and 132 and diodes 42 and 24 are formed in the same manner in the ESD protection integrated circuit 400 as transistor 130 and diode 16 are formed. A limitation, of the embodiment of FIG. 4 is that a negative ESD bus line cannot be implemented because Vss is connected to the P substrate. Therefore the ESD protection integrated circuit 400 of FIG. 4, can provide parasitic current protection under those applications where the signal bonding pads 14 and 22 operate at voltages higher than Vdd but not at voltages lower than Vss. In particular, in this embodiment parasitic currents thru transistor 130 will be reduced during normal operations of the integrated circuit 400 where voltage signals higher than a normal operating voltage, but less than the predefined voltage signals, are applied to the first signal bonding pad 14.

The benefits of using charge pumps is more pronounced when a parasitic transistor such as transistor 130 of FIG. 4 and FIG. 5 is used as opposed to when just a diode is used. Any parasitic current that flows through the base/emitter of the transistor 130 to charge the positive bus line 45 will cause the emitter/collector current to flow from 14 to 17. This means a small ESD bus line charging current can cause a much larger (beta times) current to flow in the substrate 84. Relatively large substrate currents can lead to latch-up which can cause reliability problems.

Figure 6:
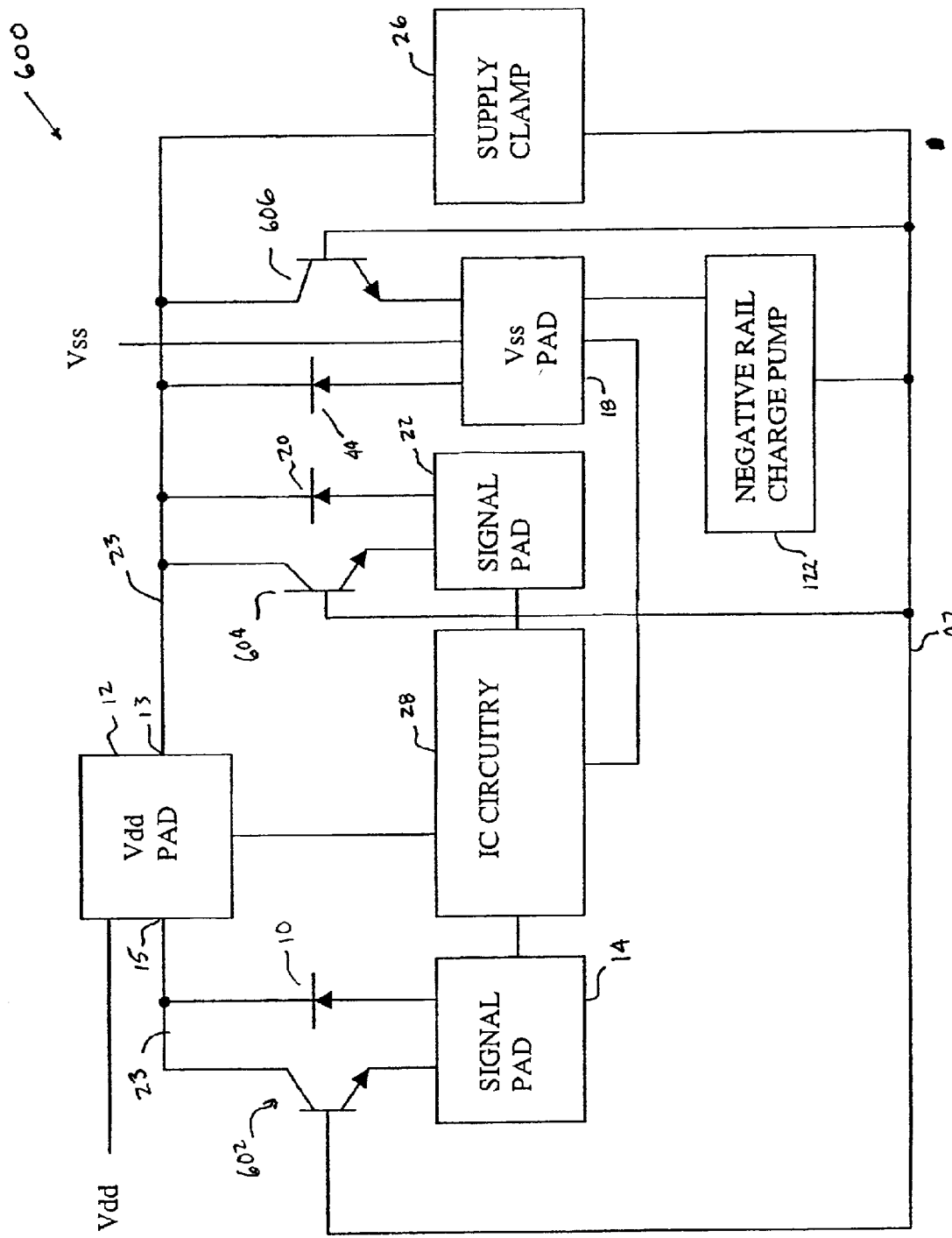
FIG. 6 is a schematic diagram of one embodiment of the present invention with a negative rail charge pump.

In another embodiment, a single well CMOS P well structure is used to form an ESD protected integrated circuit 600 that protects against voltages lower than Vss. This embodiment is illustrated in FIG. 6. As illustrated, the ESD protection circuit 600 includes the negative rail charge pump 122 and transistors 602, 604 and 606. The negative rail charge pump 122 is coupled between the negative ESD bus line 47 and the Vss bonding pad 18 and is used to precharge the negative ESD bus line 47. The collector/emitter path of transistor 606 is coupled between the Vss bonding pad 18 and a first input 13 of the Vdd bonding pad 12. The base terminal of transistor 606 is coupled to the negative ESD bus line 47. The collector/emitter path of transistor 604 is coupled between the second signal bonding pad 22 and the first input 13 of the Vdd bonding pad 12. The base terminal of transistor 604 is coupled to the negative ESD bus line 47. The collector/emitter path of transistor 602 is coupled between the first signal bonding pad 14 and a second input 15 of the Vdd bonding pad 12. The base terminal of transistor 602 is coupled to the negative ESD bus line 47.

Moreover, as FIG. 6 illustrates, Vdd bonding pad 12 and the Vss bonding pad 18 are coupled to the IC circuitry 28. In addition, the first signal bonding pad 14 and the second signal bonding pad 22 are also coupled to the IC circuitry 28. As illustrated, the supply clamp 26 is coupled between the negative ESD bus line 47 and the first input 13 of the Vdd pad 12. In addition, Vdd is coupled to the Vdd bonding pad 12 and Vss is coupled to the Vss bonding pad 18. Also illustrated in FIG. 6 is Vdd bus line 23.

Negative charge pump 122 of the present invention is used to precharge the negative ESD bus line 47. This causes the base/emitter path of the transistors 602, 604 and 606 to be reversed biased. In operation, for example, if a negative polarity ESD pulse is applied between signal pads 14 and 22 of ESD protection circuit 600, a discharge current will start at signal pad 22 and flow through the now forward biased diode 20 to Vdd bus line 23. The current will then flow through supply clamp 26 to the negative ESD bus line 47. The current will then flow through the now forward biased base/emitter path of transistor 602 to signal pad 14. In addition to the aforementioned discharge path, another secondary path will also be taken by the discharge current. This secondary path flows from signal pad 22 through forward biased diode 20 to Vdd bus line 23. Current then flows through the collector/emitter path of transistor 602 to signal pad 14. Current passing through the base/emitter path of transistor 602 allows the current through the collector/emitter path of transistor 602.

Figure 7:
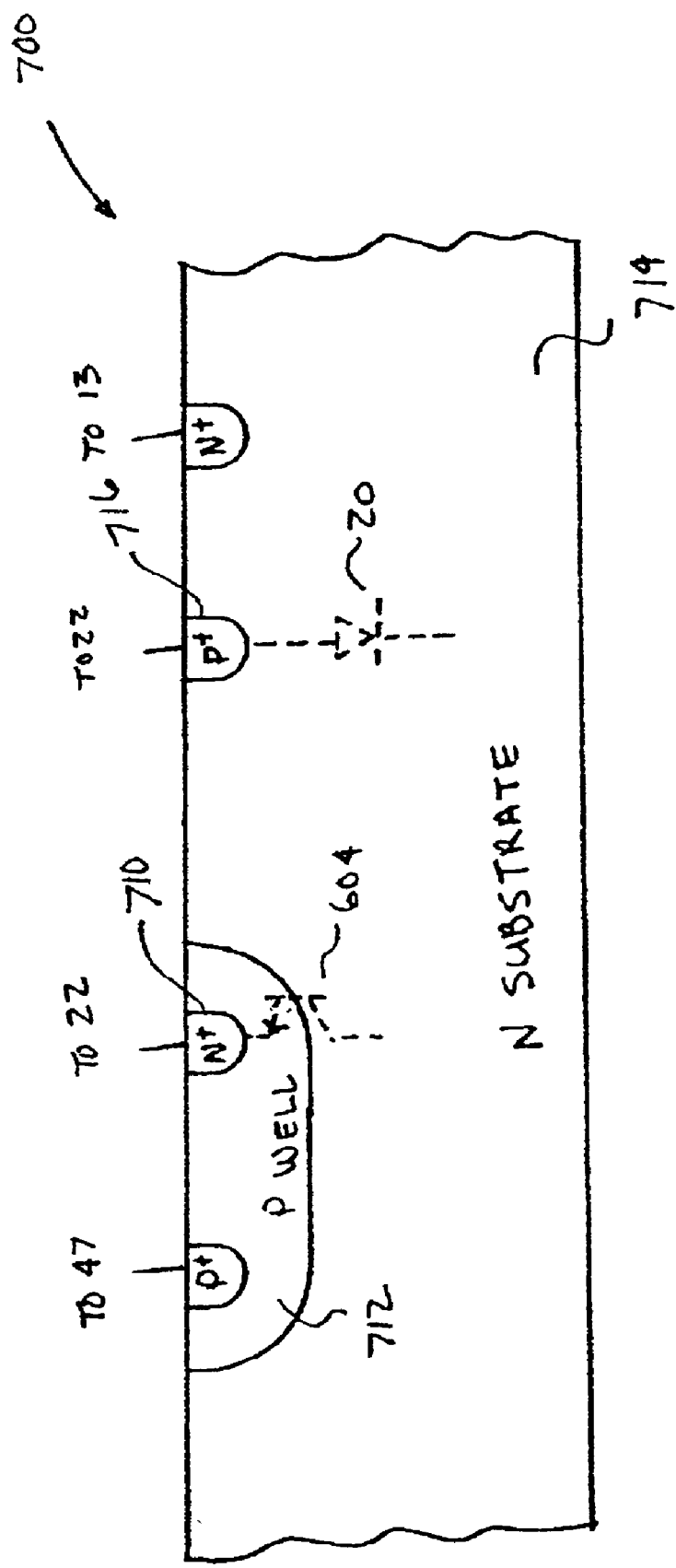
FIG. 7 is a cross-sectional view of a portion of an integrated circuit of the present invention illustrating one embodiment of a transistor in a P well CMOS structure.

Transistors 602, 604 and 606 in the embodiment of FIG. 6 are created with a single well CMOS P well process in an P well CMOS structure. A cross sectional view of a portion of the integrated circuit that contains the ESD protection integrated circuit 600 of FIG. 6 is illustrated in FIG. 7. In particular, FIG. 7 illustrates transistor 604. As FIG. 7 illustrates, a N+ source/drain diffusion 710 is formed in a P well diffusion 712. The N+ diffusion 710 and the P well diffusion 712 together with the underlying N substrate 714, form the vertical parasitic NPN transistor 604. FIG. 7 also illustrates diode 20. Diode 20 is formed by placing an P+ source/drain diffusion 716 into the N substrate 714. In addition, transistors 602 and 606 and diodes 10 and 44 are formed in the same manner in the ESD protection integrated circuit 600 as transistor 604 and diode 20 are formed. A limitation, of the embodiment of FIG. 6 is that a positive ESD bus line cannot be implemented because Vdd is connected to the N substrate. Therefore the ESD protection integrated circuit 600 of FIG. 6, can provide parasitic current protection under those applications where the signal bonding pads 14 and 22 operate at voltages lower than Vss but not at voltages higher than Vdd. In particular, in this embodiment, parasitic currents thru transistor 602 will be reduced during normal operations of the integrated circuit 600 where voltage signals lower than a normal operating voltage, but more than the predefined voltage signals, are applied to the first signal bonding pad 14.

Although, FIGS. 4 and 6 both illustrate a single-well CMOS structure that limits the embodiments illustrated in FIGS. 4 and 6 to protect against parasitic currents when voltage signals are applied to signal connections that are either over Vdd or lower than Vss, it will be understood in the art that a twin-well CMOS structure could be implemented wherein both N type and P type wells are created in a P type or N type substrate, with appropriate isolation between the two wells. In this embodiment, internal circuitry will be protected from parasitic currents due to voltage levels exceeding Vdd as well as voltage level being below Vss being applied to signal connections.

Although specific embodiments have been illustrated and described herein, it will be appreciated by those of ordinary skill in the art that any arrangement, which is calculated to achieve the same purpose, may be substituted for the specific embodiment shown. This application is intended to cover any adaptations or variations of the present invention. Therefore, it is manifestly intended that this invention be limited only by the claims and the equivalents thereof.

What is claimed is:

1. An electrostatic discharge protection circuit comprising:
   one or more electrostatic bus lines to direct electrostatic discharge around internal circuitry;
   a plurality of signal bonding pads to receive external voltage signals, each signal bonding pad is coupled to an associated electrostatic bus line via an unidirectional conducting device; and
   a charge pump for each electrostatic bus line to precharge its associated electrostatic bus line to an associated predetermined voltage level, wherein pre-charging each electrostatic bus line to its predetermined voltage level reduces transient currents on the signal bonding pads associated with capacitive charging of the electrostatic bus lines when the external voltage signal levels are beyond normal supply voltage ranges.

2. The electrostatic discharge protection circuit of claim 1, wherein each electrostatic bus line is pre-charged to a voltage level beyond a normal supply voltage range.

3. The electrostatic discharge protection circuit of claim 1, wherein each charge pump comprises:
   a first capacitor having a first plate and a second plate;
   a second capacitor having a first plate and a second plate, the first plate of the second capacitor is coupled to an electrostatic bus line, the second plate of the second capacitor is coupled to a first bonding pad and a first polarity terminal of a power supply;
   a first switch having a first position and a second position, wherein when the first switch is in the first position the first plate of the first capacitor is coupled to the first polarity terminal of the power source, the second plate of the second capacitor and the first bonding pad, further wherein when the first switch is positioned in the second position the first plate of the first capacitor is coupled to the first plate of the second capacitor and the electrostatic bus line; and
   a second switch having a first position and a second position, wherein when the second switch is in the first position the second plate of the first capacitor is coupled to a second polarity terminal of a power supply and a second bonding pad, further wherein when the second switch is in the second position the second plate of the first capacitor is coupled to the first polarity terminal of the power supply, the second plate of the second capacitor and the first bonding pad.

4. The electrostatic discharge protection circuit of claim 1, wherein each unidirectional conducting device comprises:
   a steering diode coupled to steer the electrostatic discharge away from the internal circuitry, wherein the pre-charging of an associated electrostatic bus line causes the steering diode to remain reversed biased even if voltages on associated signal bonding pads are beyond the normal supply voltage range and below a predetermined voltage range.

5. The electrostatic discharge protection device of claim 4, wherein the steering diode is a rectifier diode.

6. The electrostatic discharge protection device of claim 4, wherein the steering diode is a Schottky diode.

7. The electrostatic discharge protection device of claim 1, wherein each unidirectional conducting device comprises:
   a junction of a bipolar junction transistor.

8. The electrostatic discharge protection device of claim 7, wherein the bipolar junction transistor is formed with in a complementary metal-oxide semiconductor (CMOS) N well structure.

9. The electrostatic discharge protection device of claim 7, wherein the bipolar junction transistor is formed in a CMOS P well structure.

10. The electrostatic discharge protection device of claim 1, further comprising:
    a switching device coupled to each electrostatic bus line to selectively pass electrostatic pulses from one of the bonding pads to another of the bonding pads.

11. The electrostatic discharge protection device of claim 10, wherein the switching device comprises:
    a bipolar junction transistor coupled to switch in response to the electrostatic pulses.

12. The electrostatic discharge protection device of claim 10, wherein the switching device comprises:
    a MOSFET coupled to switch in response to the electrostatic pulses.

13. The electrostatic discharge protection device of claim 10, wherein the switching device comprises:
    a zener diode.

14. An integrated circuit comprising:
    functional circuitry;
    a first electrostatic discharge (ESD) bus line to direct electrostatic discharge pulses away from the functional circuitry;
    a first charge pump coupled to charge the first ESD bus line to a predetermined first voltage;
    a second ESD bus line to further direct electrostatic discharge pulses away from the functional circuitry;
    a second charge pump coupled to charge the second ESD bus line to a predetermined second voltage;
    a first unidirectional conducting device coupled between a first signal connection and the first ESD bus line;
    a second unidirectional conducting device coupled between a second signal connection and the second ESD bus line; and
    wherein the first and second ESD bus lines are charged to their respective first and second voltage levels to reduce transient currents through the first and second unidirectional conducting devices when voltages applied to the first and second signal connections are outside the normal range of power supply operating voltages for the integrated circuit.

15. The integrated circuit of claim 14, wherein the first unidirectional conducting device is a diode having a cathode terminal coupled to the first ESD bus line and an anode terminal coupled to the first signal connection.

16. The integrated circuit of claim 14, wherein the second unidirectional conducting device is a diode having a cathode terminal coupled to the second signal connection and an anode terminal coupled to the second ESD bus line.

17. The integrated circuit of claim 14, wherein the first unidirectional conducting device comprises a pn junction wherein the N type material is coupled to the first ESD bus line and the P type material is coupled to the first signal connection, further wherein the second unidirectional device comprises pn material wherein the N type material is coupled to the second signal connection and the P type material is coupled to the second ESD bus line.

18. The integrated circuit of claim 14, wherein the first voltage is a positive voltage with respect to a positive terminal of a power supply to the integrated circuit and the second voltage is a negative voltage with respect to a negative terminal of the power supply.

19. The integrated circuit of claim 14, wherein the first voltage is greater than an expected positive signal input voltage provided to the integrated circuit, further wherein the second voltage is less than a negative expected signal input voltage provided to the integrated circuit.

20. The electrostatic discharge protection circuit of claim 14, wherein the first charge pump comprises:
    a first capacitor having a first plate and a second plate;
    a second capacitor having a first plate and a second plate, the first plate of the second capacitor is coupled to the first ESD bus line, the second plate of the second capacitor is coupled to a first bonding pad and a first polarity terminal of a power supply;
    a first switch having a first position and a second position, wherein when the first switch is in the first position the first plate of the first capacitor is coupled to the first polarity terminal of the power source, the second plate of the second capacitor and the first bonding pad, further wherein when the first switch is positioned in the second position the first plate of the first capacitor is coupled to the first plate of the second capacitor and the first ESD bus line; and
    a second switch having a first position and a second position, wherein when the second switch is in the first position the second plate of the first capacitor is coupled to a second polarity terminal of a power supply and a second bonding pad, further wherein when the second switch is in the second position the second plate of the first capacitor is coupled to the first polarity terminal of the power supply, the second plate of the second capacitor and the first bonding pad.

21. The electrostatic discharge protection circuit of claim 14, wherein the second charge pump comprises:
    a first capacitor having a first plate and a second plate;
    a second capacitor having a first plate and a second plate, the first plate of the second capacitor is coupled to second ESD bus line, the second plate of the second capacitor is coupled to a first bonding pad and a first polarity terminal of a power supply;
    a first switch having a first position and a second position, wherein when the first switch is in the first position the first plate of the first capacitor is coupled to the first polarity terminal of the power source, the second plate of the second capacitor and the first bonding pad, further wherein when the first switch is positioned in the second position the first plate of the first capacitor is coupled to the first plate of the second capacitor and the second ESD bus line; and
    a second switch having a first position and a second position, wherein when the second switch is in the first position the second plate of the first capacitor is coupled to a second polarity terminal of a power supply and a second bonding pad, further wherein when the second switch is in the second position the second plate of the first capacitor is coupled to the first polarity terminal of the power supply, the second plate of the second capacitor and the first bonding pad.

22. The integrated circuit of claim 14, further comprising:
    a switching device coupled between the first and second ESD bus lines, the switching device is switchable between a high impedance and low impedance state.

23. The integrated circuit of claim 22, wherein when a voltage pulse greater than a predetermined third voltage is applied between the first and second ESD bus lines, the switching device closes and conducts such that the resulting current is steered from the first ESD bus line and through the switching device to the second ESD bus line thereby limiting the voltage pulse and routing the resulting current pulse away from functional circuitry of the integrated circuit.

24. The integrated circuit of claim 22, wherein the switching device further comprises:
    a capacitor;
    a resistor, the capacitor and resistor are coupled in series between the first and second ESD bus lines, wherein the capacitor is coupled to the first ESD bus line and the resistor is coupled to the second ESD bus line; and
    a transistor, the transistor having a collector coupled to the first ESD bus line and an emitter coupled to the second ESD bus line, the transistor further having a base coupled to a connection between the capacitor and the resistor.

25. The integrated circuit of claim 22, wherein the switching device further comprises:
    a zener diode;
    a resistor, the zener diode and resistor are coupled in series between the first and second ESD bus lines, wherein an anode of the zener diode is coupled to the first ESD bus line and the resistor is coupled to the second ESD bus line; and
    a transistor, the transistor having a collector coupled to the first ESD bus line and an emitter coupled to the second ESD bus line, the transistor further having a base coupled to a connection between a cathode of the zener diode and the resistor.

26. An ESD protected integrated circuit comprising:
    a positive ESD bus line to route positive electrostatic discharge pulses around functional circuitry;
    first and second signal bonding pads to receive external voltage signals;
    a first unidirectional conducting device coupled between the first signal bonding pad and the positive ESD bus line;
    a second bus line coupled to selectively receive current from the positive ESD bus line;
    a second unidirectional conducting device coupled between the second signal bonding pad and the second bus line; and a positive rail charge pump coupled to charge the positive ESD bus line to a predefined voltage level, wherein the predefined voltage level is higher than anticipated voltage signal levels that will be applied to the first signal bonding pad to reduce parasitic currents through the first unidirectional conducting device during normal operations of the integrated circuit where voltage signals higher than a normal power supply operating voltage, but less than the predefined voltage, are applied to the first signal bonding pad.

27. The ESD protected integrated circuit of claim 26, wherein the second unidirectional conducting device comprises a diode.

28. The ESD protected integrated circuit of claim 26, further comprising:
a supply clamp to selectively conduct current from the positive ESD bus line to the second bus line when a positive electrostatic discharge pulse is detected, the supply clamp is coupled between the positive ESD bus line and the second bus line.

29. The ESD protected integrated circuit of claim 26, wherein each of the first and second unidirectional conducting devices comprise a diode.

30. The ESD protected integrated circuit of claim 29, wherein the predefined voltage level keeps the diodes in a reverse bias state during normal operation.

31. The ESD protected integrated circuit of claim 26, wherein the first unidirectional conducting device comprises a transistor.

32. The ESD protected integrated circuit of claim 31, wherein a base terminal of the transistor is coupled to the positive ESD bus line and the collector emitter path of the first transistor is coupled between the first signal bonding pad and a first input of a Vss pad, further wherein the Vss pad is used to couple a negative supply voltage to the second bus line.

33. The ESD protected integrated circuit of claim 31, wherein the transistor is formed in a N well CMOS structure.

34. The ESD protection integrated circuit of claim 33, wherein the N well CMOS structure further comprises:
a N type conductivity well formed in a P type conductivity substrate of the integrated circuit;
a N type conductivity base formed by the well;
a P type conductivity emitter with high dopant density formed in the well; and
a P type conductivity collector formed by the substrate.

35. The ESD protection integrated circuit of claim 34, further comprising:
a diode coupled between the first signal pad and the second bus line, the diode having a N type conductivity cathode with high dopant density formed in the P type conductivity substrate.

36. An ESD protected integrated circuit comprising:
a negative ESD bus line to route negative electrostatic discharge pulses around functional circuitry;
first and second signal bonding pads to receive external voltage signals;
a first unidirectional conducting device coupled between the first signal bonding pad and the negative ESD bus line;
a second bus line coupled to selectively receive current from the negative ESD bus line;
a second unidirectional conducting device coupled between the second signal bonding pad and the second bus line; and a negative rail charge pump coupled to charge the negative ESD bus line to a predefined voltage level, wherein the predefined voltage level is lower than anticipated voltage signal levels that will be applied to the first signal bonding pad to reduce parasitic currents through the first unidirectional conducting devices during normal operations of the integrated circuit where voltage signals lower than a normal power supply operating voltage, but more than the predefined voltage, are applied to the first signal bonding pad.

37. The ESD protected integrated circuit of claim 36, wherein the second unidirectional conducting device comprises a diode.

38. The ESD protected integrated circuit of claim 36, further comprising:
a supply clamp to selectively conduct current from the negative ESD bus line to the second bus line when a negative electrostatic discharge pulse is detected, the supply clamp is coupled between the negative ESD bus line and the second bus line.

39. The ESD protected integrated circuit of claim 36, wherein each of the first and second unidirectional conducting devices comprise a diode.

40. The ESD protected integrated circuit of claim 39, wherein the predefined voltage level keeps the diodes in a reverse bias state during normal operation.

41. The ESD protected integrated circuit of claim 36, wherein the first unidirectional conducting device comprises a transistor.

42. The ESD protected integrated circuit of claim 41, wherein a base terminal of the transistor is coupled to the negative ESD bus line and the collector/emitter path of the first transistor is coupled between the first signal bonding pad and a first input of a Vdd pad, further wherein the Vdd pad is used to couple a positive supply voltage to the second bus line.

43. The ESD protected integrated circuit of claim 41, wherein the transistor is formed in a P well CMOS structure.

44. The ESD protection integrated circuit of claim 43, wherein the P well CMOS structure further comprises:
a P type conductivity well formed in a N type conductivity substrate of the integrated circuit;
a P type conductivity base formed by the well;
a N type conductivity emitter with high dopant density formed in the well; and
a N type conductivity collector formed by the substrate.

45. The ESD protection integrated circuit of claim 44, further comprising:
a diode coupled between the first signal pad and the second bus line, the diode having a P type conductivity anode with high dopant density formed in the N type conductivity substrate.

46. A method of operating an integrated circuit that requires signal voltages outside the normal range of operational power supply voltages, the integrated circuit including an electrostatic discharge circuit having one or more electrostatic discharge bus lines, the method comprising:
pre-charging each of the electrostatic discharge bus lines to a respective predetermined voltage level, wherein each predetermined voltage level is a voltage level beyond the signal voltage level expected to be applied to the integrated circuit.

47. The method of claim 46, wherein pre-charging the electrostatic discharge bus lines prevents parasitic current from flowing through unidirectional conducting devices when signal voltages are applied to the integrated circuit that are outside the normal range of operating power supply voltages during operation of the integrated circuit.

48. The method of claim 46, wherein an electrostatic bus line is pre-charged to a voltage level higher than an expected positive voltage signal.

49. The method of claim 46, wherein an electrostatic bus line is pre-charged to a voltage level lower than an expected negative voltage signal.

50. A method of operating an integrated circuit having electrostatic discharge protection comprising:

coupling a positive ESD bus line to the integrated circuit to direct positive electrostatic pulses away from functional circuitry of the integrate circuit;

pre-charging the positive ESD bus line to a predetermined positive voltage level, wherein the predetermined positive voltage level is above a voltage level of expected signals to be applied to the integrated circuit;

coupling a negative ESD bus line to the integrated circuit to direct negative electrostatic pulses away from the functional circuitry of the integrated circuit; and pre-charging the negative ESD bus line to a predetermined negative voltage level, wherein the predetermined negative voltage level is below the voltage level of expected signals to be applied to the integrated circuit.

51. The method of claim 50, further comprising:

limiting the voltage between the positive and negative ESD bus lines with a supply clamp.

52. The method of claim 50, further comprising:

coupling one more unidirectional conductors between the positive ESD bus line and one or more signal connections to direct electrostatic pulses away from the functional circuitry, wherein the pre-charging of the positive ESD bus line to the predetermined positive voltage level reduces parasitic currents through unidirectional conductors during normal operations of the integrated circuit.

53. The method of claim 50, further comprising:

coupling one more unidirectional conductors between the negative ESD bus line and one or more signal connections to direct electrostatic pulses away from the functional circuitry, wherein the pre-charging of the negative ESD bus line to the predetermined negative voltage level reduces parasitic currents through unidirectional conductors during normal operations of the integrated circuit.

54. The method of claim 50, wherein the positive ESD bus line is pre-charged to a voltage level above the positive supply voltage Vdd.

55. The method of claim 54, wherein pre-charging the positive ESD bus line minimizes parasitic currents through unidirectional conducting devices when operating signals are applied to the integrated circuit that having voltage levels above Vdd but less than the predetermined positive voltage level.

56. The method of claim 50, wherein the negative ESD bus line is pre-charged to a voltage level below the negative supply voltage Vss.

57. The method of claim 56, wherein pre-charging the negative ESD bus line minimizes parasitic currents through unidirectional conducting devices when operating signals are applied to the integrated circuit that having voltage levels below Vss but higher than the predetermined negative voltage level.

* * * * *